United States Patent
Nagai et al.

(10) Patent No.: US 8,598,584 B2
(45) Date of Patent: Dec. 3, 2013

(54) THIN-FILM TRANSISTOR DEVICE AND METHOD OF MANUFACTURING THE SAME

(75) Inventors: Hisao Nagai, Osaka (JP); Sadayoshi Hotta, Osaka (JP); Genshiro Kawachi, Chiba (JP)

(73) Assignees: Panasonic Corporation, Osaka (JP); Panasonic Liquid Crystal Display Co., Ltd., Himeji-Shi (JP)

( * ) Notice: Subject to any disclaimer, the term of this patent is extended or adjusted under 35 U.S.C. 154(b) by 44 days.

(21) Appl. No.: 13/274,546

(22) Filed: Oct. 17, 2011

(65) Prior Publication Data

US 2012/0032180 A1 Feb. 9, 2012

Related U.S. Application Data

(63) Continuation of application No. PCT/JP2011/001582, filed on Mar. 17, 2011.

(30) Foreign Application Priority Data

May 10, 2010 (WO) ................ PCT/JP2010/003152

(51) Int. Cl.
*H01L 33/08* (2010.01)
*H01L 21/336* (2006.01)

(52) U.S. Cl.
USPC .......... 257/59; 257/72; 257/66; 257/E33.053; 257/E21.412; 438/158; 438/159; 438/161

(58) Field of Classification Search
USPC ............... 257/59, 72, E33.053, E21.412, 66; 438/158, 159, 161
See application file for complete search history.

(56) References Cited

U.S. PATENT DOCUMENTS

| 6,001,539 A | 12/1999 | Lyu et al. |
| 6,100,954 A | 8/2000 | Kim et al. |
| 6,188,452 B1 | 2/2001 | Kim et al. |
| 6,211,928 B1 | 4/2001 | Oh et al. |
| 6,580,127 B1 * | 6/2003 | Andry et al. ................ 257/347 |

FOREIGN PATENT DOCUMENTS

| EP | 0 473 988 | 3/1992 |
| JP | 64-046982 | 2/1989 |
| JP | 6-342909 | 12/1994 |

(Continued)

OTHER PUBLICATIONS

International Search Report and Written Opinion of PCT/JP2011/001582, dated Apr. 19, 2011.
International Search Report and Written Opinion of PCT/JP2010/003152, dated Aug. 3, 2010.

(Continued)

*Primary Examiner* — Thinh T Nguyen
(74) *Attorney, Agent, or Firm* — Greenblum & Bernstein, P.L.C.

(57) ABSTRACT

In the thin-film transistor device: the stacked thickness of either a source electrode or a drain electrode and a corresponding one of silicon layers is the same value or a value close to the same value as the stacked thickness of a first channel layer and a second channel layer; the stacked thickness of the first channel layer and the second channel layer is the same in a region between the source electrode and the drain electrode and above the source electrode and the drain electrode; the first channel layer and the second channel layer are sunken in the region between the source electrode and the drain electrode, following a shape between the source electrode and the drain electrode; and the gate electrode has one region overlapping with the source electrode and an other region overlapping with the drain electrode.

25 Claims, 10 Drawing Sheets

(56) References Cited

FOREIGN PATENT DOCUMENTS

| | | |
|---|---|---|
| JP | 7-045836 | 2/1995 |
| JP | 10-041519 | 2/1998 |
| JP | 2001-077372 | 3/2001 |

OTHER PUBLICATIONS

IPRP of PCT/JP2010/003152, dated Feb. 8, 2011.
International Preliminary Report on Patentability for PCT/JP2010/003152.

* cited by examiner

THIN-FILM TRANSISTOR DEVICE AND METHOD OF MANUFACTURING THE SAME

CROSS REFERENCE TO RELATED APPLICATION

This is a continuation application of PCT application No. PCT/JP2011/001582 filed on Mar. 17, 2011, designating the United States of America.

BACKGROUND OF THE INVENTION (1) Field of the Invention

The present invention relates to thin-film transistor devices and methods of manufacturing the same, and relates particularly to a thin-film transistor device for driving and for switching in an organic electroluminescence (EL) display device and a liquid crystal display device, and to a method of manufacturing the same.

(2) Description of the Related Art

In electronic devices, such as television receivers, which use an organic electroluminescence (EL) display device or a liquid crystal display device, luminescence elements which are arranged in a matrix and configure the organic EL display device or the liquid crystal display are driven by thin-film transistor (TFT) devices.

Top gate (staggered) thin-film transistor devices, for example, are available as such a thin-film transistor device. In addition, a top gate thin-film transistor device includes a source electrode, a drain electrode, a semiconductor layer (channel layer), and a gate electrode which are sequentially stacked on a substrate. Among thin-film transistor devices, thin-film transistor devices using amorphous silicon as the material of the channel layer are common due to ease of manufacturing (see for example Patent Reference 1: Japanese Unexamined Patent Application Publication No. 6-342909).

SUMMARY OF THE INVENTION

However, when amorphous silicon is used in the channel layer, sufficient mobility cannot be obtained in the channel, and thus sufficient on-current cannot be obtained. Therefore, the current value at a linear region of the electrical characteristics of the thin-film transistor device becomes low.

Although, in the thin-film transistor device described in Patent Reference 1, a polycrystalline silicon (P—Si) layer is provided adjacent to an amorphous hydrogenated silicon (a-Si:H) layer in the channel layer, sufficient carrier mobility cannot be obtained even with such configuration.

Thus, in view of the aforementioned problems, the present invention has as an object to provide a thin-film transistor device that allows obtainment of sufficient carrier mobility and a method of manufacturing the same.

In order to achieve the aforementioned object, the thin-film transistor device according to an aspect of the present invention is characterized in including: a substrate; a source electrode and a drain electrode formed on the substrate; silicon layers, one of which is stacked within a top surface region of the source-electrode and an other of which is stacked within a top surface of the drain electrode, the silicon layers being amorphous and doped with an impurity; a first channel layer formed continuously (i) on the substrate, in a region between the source electrode and the drain electrode, (ii) on a side surface of each of the source electrode and the drain electrode, and (iii) on a side surface and a top surface of each of the silicon layers, the first channel layer being made of an amorphous silicon layer; a second channel layer stacked on the first channel layer and made of one of a polysilicon layer and a microcrystalline silicon layer, the second channel layer being formed continuously (i) in a region between the source electrode and the drain electrode and (ii) laterally from and above the silicon layers; a gate insulating film formed on the second channel layer; and a gate electrode formed on the gate insulating film, wherein a stacked thickness of either the source electrode or the drain electrode and a corresponding one of the silicon layers is a same value or a value close to the same value as a stacked thickness of the first channel layer and the second channel layer, the stacked thickness of the first channel layer and the second channel layer is the same in the region between the source electrode and the drain electrode and above the source electrode and the drain electrode, the first channel layer and the second channel layer are sunken in the region between the source electrode and the drain electrode, following a shape between the source electrode and the drain electrode, and the gate electrode has one region overlapping with the source electrode and an other region overlapping with the drain electrode.

Since the thin-film transistor device according to an aspect of the present invention has a structure in which the source electrode and the drain electrode are in direct contact with a channel layer, and the thickness of the source electrode and the drain electrode is less than the thickness of the channel layer, the thin-film transistor device is capable of reducing the effect of the widening of the depletion layer formed by a schottky barrier, and increasing the current at a linear region of the electrical characteristics of a TFT. As a result, it is possible to increase the current value at a linear region of the electrical characteristics of the TFT, in a top gate thin-film transistor device.

Further Information about Technical Background to this Application

The disclosure of PCT application No. PCT/JP2010/003152 filed on May 10, 2010 including specification, drawings and claims is incorporated herein by reference in its entirety.

The disclosure of PCT application No. PCT/JP2011/001582 filed on Mar. 17, 2011, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Figure 1A:
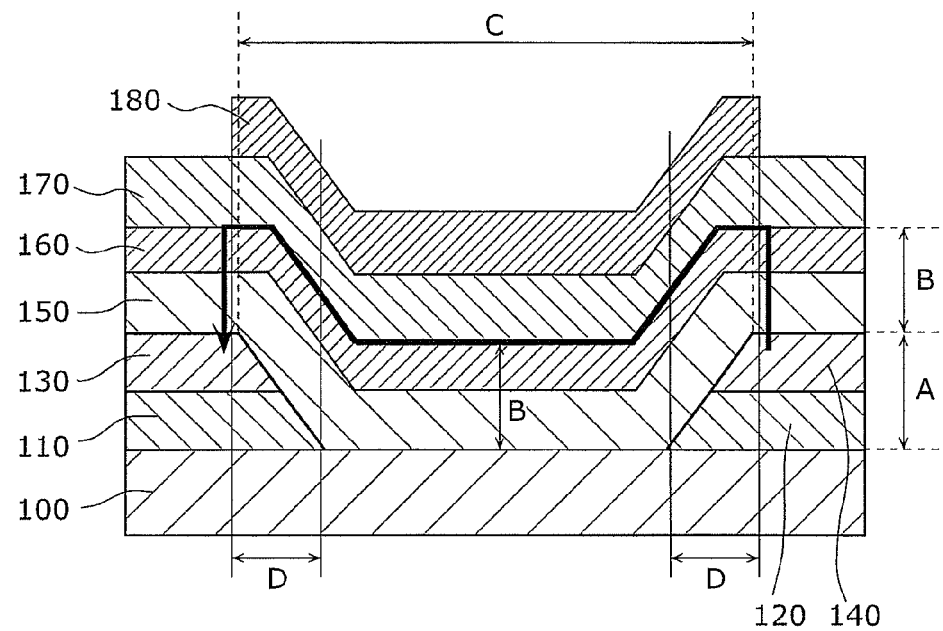
FIG. 1A is a cross-sectional view for schematically showing a configuration of a thin-film transistor device according to an embodiment of the present invention.

In order to achieve the aforementioned object, the thin-film transistor device according to an aspect of the present invention is characterized in including: a substrate; a source electrode and a drain electrode formed on the substrate; silicon layers, one of which is stacked within a top surface region of the source electrode and an other of which is stacked within a top surface of the drain electrode, the silicon layers being amorphous and doped with an impurity; a first channel layer formed continuously (i) on the substrate, in a region between the source electrode and the drain electrode, (ii) on a side surface of each of the source electrode and the drain electrode, and (iii) on a side surface and a top surface of each of the silicon layers, the first channel layer being made of an amorphous silicon layer; a second channel layer stacked on the first channel layer and made of one of a polysilicon layer and a microcrystalline silicon layer, the second channel layer being formed continuously (i) in a region between the source electrode and the drain electrode and (ii) laterally from and above the silicon layers; a gate insulating film formed on the second channel layer; and a gate electrode formed on the gate insulating film, wherein a stacked thickness of either the source electrode or the drain electrode and a corresponding one of the silicon layers is a same value or a value close to the same value as a stacked thickness of the first channel layer and the second channel layer, the stacked thickness of the first channel layer and the second channel layer is the same in the region between the source electrode and the drain electrode and above the source electrode and the drain electrode, the first channel layer and the second channel layer are sunken in the region between the source electrode and the drain electrode, following a shape between the source electrode and the drain electrode, and the gate electrode has one region overlapping with the source electrode and an other region overlapping with the drain electrode.

Here, in the thin-film transistor device according to an aspect of the present invention, when the thin-film transistor device is turned ON, a resistance of a boundary region between (i) an end region of the second channel layer which is sunken between the source electrode and the drain electrode and (ii) the gate electrode may be less than a resistance of a region of the first channel layer which is sunken between the source electrode and the drain electrode, that is in contact with the source electrode and the drain electrode.

Furthermore, in the thin-film transistor device according to an aspect of the present invention, the stacked thickness of the first channel layer and the second channel layer may be equal to or less than 130 nm.

In a structure in which the first channel layer and the side surfaces of the source electrode, the drain electrode, and the silicon layers are in contact, a depletion layer is created in the region of the first channel layer which is in contact with the side surfaces of the source electrode, the drain electrode, and the silicon layers. However, since the stacked thickness of the first channel layer and the second channel layer is the same value or a value close to the same value as the stacked thickness of either the source electrode or the drain electrode and a corresponding one of the silicon layers, the effect of the depletion layer created in the first channel layer on the second channel layer is reduced. Therefore, it is possible to suppress the deterioration of electron density within the second channel layer caused by the depletion layer, and thus it is possible to secure the desired amount of current flowing from the source electrode to the drain electrode via the second channel.

At this time, when the stacked thickness of the first channel layer and the second channel layer increases, the electrical resistance of the channel layers increases just as much, and the amount of current flowing from the source electrode to the drain electrode via the second channel decreases. However, since the stacked thickness of the first channel layer and the second channel layer is the same value or a value close to the same value as the stacked thickness of either the source electrode or the drain electrode and a corresponding one of the silicon layers, such a decrease in the amount of current can be suppressed.

Furthermore, in the thin-film transistor device according to an aspect of the present invention, the value close to the same value may be a value that is within ±15 percent of the same value.

Assuming that 100 percent of on-characteristics can be obtained when the stacked thickness is the same value, setting the value close to the same value as a value that is within ±15 percent of the same value makes it possible to ensure a minimum of 70% of the on-characteristics.

Furthermore, in the thin-film transistor device according to an aspect of the present invention, the value close to the same value may be a value that is within ±45 percent of the same value when the stacked thickness of the first channel layer and the second channel layer is between 25 and 35 nm, inclusive.

Assuming that 100 percent of on-characteristics can be obtained when the stacked thickness is the same value, setting the value close to the same value as a value that is at least within ±45 percent of the same value makes it possible to ensure a minimum of 70% of the on-characteristics.

Furthermore, in the thin-film transistor device according to an aspect of the present invention, the value close to the same value may be a value that is within ±17 percent of the same value when the stacked thickness of the first channel layer and the second channel layer is between 55 and 65 nm, inclusive.

Assuming that 100 percent of on-characteristics can be obtained when the stacked thickness is the same value, setting the value close to the same value as a value that is at least within ±17 percent of the same value makes it possible to ensure a minimum of 70% of the on-characteristics.

Furthermore, in the thin-film transistor device according to an aspect of the present invention, the value close to the same value may be a value that is within ±15 percent of the same value when the stacked thickness of the first channel layer and the second channel layer is between 105 and 115 nm, inclusive.

Assuming that 100 percent of on-characteristics can be obtained when the stacked thickness is the same value, setting the value close to the same value to be a value within ±15 percent makes it possible to ensure a minimum of 70% of the on-characteristics.

Furthermore, the method of manufacturing a thin-film transistor device according to an aspect of the present invention is characterized in including: preparing a substrate; forming a metal film on the substrate; forming a resist on the metal film; placing a mask above the resist; patterning the resist using the mask, patterning the metal film using the patterned resist as a mask to form the patterned metal film into a source electrode and a drain electrode; stacking silicon layers which are amorphous and doped with an impurity, one of the silicon layers being stacked within a predetermined region in a top surface of the source electrode, and an other of the silicon layers being stacked within a predetermined region in a top surface of the drain electrode; forming a first channel layer continuously (i) on the substrate, in a region between the source electrode and the drain electrode, (ii) on a side surface of each of the source electrode and the drain electrode, and (iii) on a side surface and a top surface of each of the silicon layers, the first channel layer being made of an amorphous silicon layer; forming a second channel layer on the first channel layer, continuously (i) in a region between the source electrode and the drain electrode and (ii) laterally from and above the silicon layers, the second channel layer being made of one of a polysilicon layer and a microcrystalline silicon layer; forming a gate insulating film on the second channel layer; and forming a gate electrode formed on the gate insulating film, wherein a stacked thickness of either the source electrode or the drain electrode and a corresponding one of the silicon layers is a same value or a value close to the same value as a stacked thickness of the first channel layer and the second channel layer, the stacked thickness of the first channel layer and the second channel layer is the same in the region between the source electrode and the drain electrode and above the source electrode and the drain electrode, the first channel layer and the second channel layer are sunken in the region between the source electrode and the drain electrode, following a shape between the source electrode and the drain electrode, and the gate electrode has one region overlapping with the source electrode and an other region overlapping with the drain electrode.

Here, in the thin-film transistor device according to an aspect of the present invention, when the thin-film transistor device is turned ON, a resistance of a boundary region between (i) an end region of the second channel layer which is sunken between the source electrode and the drain electrode and (ii) the gate electrode may be less than a resistance of a region of the first channel layer which is sunken between the source electrode and the drain electrode, that is in contact with the source electrode and the drain electrode.

Furthermore, in the thin-film transistor device according to an aspect of the present invention, the stacked thickness of the first channel layer and the second channel layer is equal to or less than 130 nm.

Accordingly, in the current path from the source electrode to the drain electrode via the first channel layer, the second channel layer, and the silicon layers, the resistance of the first channel layer and the second channel layer against the current can be kept low. At the same time, the spread of the depletion layer created in the first channel layer towards the second channel layer can be kept within the region of the first channel layer, and thus the deterioration of the electron density of the second channel can be suppressed. Therefore, even when a depletion layer is created in the region of the first channel layer which is in contact with the side surfaces of the source electrode, the drain electrode, and the silicon layers, it is possible to maximize the amount of current flowing from the source electrode to the drain electrode via the first channel layer and the second channel layer. As a result, it is possible to realize a thin-film transistor device having vastly improved characteristics.

Furthermore, since the stacked thickness of the first channel layer and the second channel layer is the same value or a value close to the same value as the stacked thickness of either the source electrode or the drain electrode and a corresponding one of the silicon layers, disconnection of the film formed by the stacking the first channel layer and the second channel layer caused by a step does not occur easily at the portion of the side surfaces of the source electrode, the drain electrode, and the silicon layers. As a result, it is possible to realize a method of manufacturing a thin-film transistor device having high manufacturing yield.

Furthermore, the method of manufacturing a thin-film transistor device according to an aspect of the present invention is characterized in including: preparing a substrate; forming a metal film on the substrate; stacking a silicon layer on the metal film, the silicon layer being amorphous and doped with an impurity; forming a resist on the silicon layer; placing a mask above the resist; patterning the resist using the mask, collectively patterning the metal film and the silicon layer using the patterned resist as a mask to form the patterned metal film into a source electrode and a drain electrode; forming a first channel layer continuously (i) on the substrate, in a region between the source electrode and the drain electrode, (ii) on a side surface of each of the source electrode and the drain electrode, and (iii) on a side surface and a top surface of silicon layers resulting from the patterning the silicon layer, the first channel layer being made of an amorphous silicon layer; forming a second channel layer on the first channel layer, continuously (i) in a region between the source electrode and the drain electrode and (ii) laterally from and above the silicon layers, the second channel layer being made of one of a polysilicon layer and a microcrystalline silicon layer; forming a gate insulating film on the second channel layer; and forming a gate electrode formed on the gate insulating film, wherein a stacked thickness of either the source electrode or the drain electrode and a corresponding one of the silicon layers is a same value or a value close to the same value as a stacked thickness of the first channel layer and the second channel layer, the stacked thickness of the first channel layer and the second channel layer is the same in the region between the source electrode and the drain electrode and above the source electrode and the drain electrode, the first channel layer and the second channel layer are sunken in the region between the source electrode and the drain electrode, following a shape between the source electrode and the drain electrode, and the gate electrode has one region overlapping with the source electrode and an other region overlapping with the drain electrode.

Accordingly, it is possible to realize a thin-film transistor device having vastly improved characteristics.

Furthermore, it is possible to realize a method of manufacturing a thin-film transistor device having high manufacturing yield.

When the silicon layers are to be formed after forming the source electrode and the drain electrode, it is difficult to form the silicon layers on the side surfaces of the source electrode and the drain electrode, and, even when formed, the silicon layers formed on the side surfaces of the source electrode and the drain electrode have an unstable doping state and thus it is difficult to stabilize film quality. As a result, it is difficult to manufacture a thin-film transistor device having stable characteristics. In contrast, according to this aspect, the source electrode, the drain electrode, and the silicon layers are formed collectively, and thus it is possible to manufacture a thin-film transistor device having stable characteristics.

Furthermore, since the source electrode, the drain electrode, and the silicon layers are formed collectively using the same resist as a mask, it is possible to realize the improvement of productivity and reduction of manufacturing cost for the thin-film transistor device.

Furthermore, in the method of manufacturing a thin-film transistor according to an aspect of the present invention, in the forming of a second channel layer, the second channel layer may be formed by plasma CVD using a silane series feed gas.

According to plasma CVD (Chemical Vapor Deposition) using a silane series feed gas, it is easy to arbitrarily set the plasma condition, the type of feed gas, and so on, and thus it is possible to form a silicon layer having high crystallinity even when the substrate temperature is low. Therefore, since the second channel layer can be formed without altering the side surface form, composition, and doping state of the silicon layers, it is possible manufacture a thin-film transistor device having excellent characteristics.

Furthermore, in the method of manufacturing a thin-film transistor according to an aspect of the present invention, it is preferable that: the forming of a first channel layer and the forming of a second channel layer be performed in a same plasma CVD apparatus, the forming of a first channel layer be performed under a first plasma CVD condition, the forming of a second channel layer be performed under a second plasma CVD condition, and an inside of the plasma CVD apparatus not be exposed to air in between the forming of a first channel layer and the forming of a second channel layer.

Accordingly, since the second channel layer is successively formed without exposing the surface of the first channel layer to air, it is possible to prevent characteristic deterioration due to oxidation of the surface of the first channel layer. In other words, it becomes possible to keep the surface of the first channel layer clean, and form the second channel layer directly on the clean surface. As a result, it is possible to manufacture a thin-film transistor device having predetermined characteristics.

Furthermore, the thin-film transistor device according to an aspect of the present invention is characterized in including: a substrate; a source electrode and a drain electrode formed on the substrate; silicon layers, one of which is stacked within a top surface region of the source electrode and an other of which is stacked within a top surface of the drain electrode, the silicon layers being amorphous and doped with an impurity; a first channel layer formed continuously (i) on the substrate, in a region between the source electrode and the drain electrode, (ii) on a side surface of each of the source electrode and the drain electrode, and (iii) on a side surface and a top surface of each of the silicon layers, the first channel layer being made of an amorphous silicon layer; a second channel layer stacked on the first channel layer and made of one of a polysilicon layer and a microcrystalline silicon layer, the second channel layer being formed continuously (i) in a region between the source electrode and the drain electrode and (ii) laterally from and above the silicon layers; a gate insulating film formed on the second channel layer; and a gate electrode formed on the gate insulating film, wherein a ratio of a stacked thickness of either the source electrode or the drain electrode and a corresponding one of the silicon layers to a stacked thickness of the first channel layer and the second channel layer is 1 or a close value to 1, the stacked thickness of the first channel layer and the second channel layer is the same in the region between the source electrode and the drain electrode and above the source electrode and the drain electrode, the first channel layer and the second channel layer are sunken in the region between the source electrode and the drain electrode, following a shape between the source electrode and the drain electrode, and the gate electrode has one region overlapping with the source electrode and an other region overlapping with the drain electrode.

Accordingly, the deterioration of the electron density within the second channel layer caused by the depletion layer and the increase of resistance caused by the thickness of the channel layers can be suppressed, and thus it is possible to secure the desired amount of current flowing from the source electrode to the drain electrode via the second channel layer.

Here, in the thin-film transistor device according to an aspect of the present invention, the close value may be a value that is within 0.85 to 1.15, inclusive.

Assuming that 100 percent of the on-characteristics is obtained when the ratio is 1, setting the value that is close to 1 as a value that is at least within 0.85 to 1.15, makes it possible to ensure a minimum of 70 percent of the on-characteristics.

Furthermore, in the thin-film transistor device according to an aspect of the present invention, the close value may be a value that is within 0.55 to 1.45, inclusive, when the stacked thickness of the first channel layer and the second channel layer is between 25 and 35 nm, inclusive.

Assuming that 100 percent of the on-characteristics is obtained when the ratio is 1, setting the value that is close to 1 as a value that is at least within 0.55 to 1.45, makes it possible to ensure a minimum of 70 percent of the on-characteristics.

Furthermore, in the thin-film transistor device according to an aspect of the present invention, the value close to the same value may be a value that is within 0.83 to 1.17, inclusive, when the stacked thickness of the first channel layer and the second channel layer is between 55 and 65 nm, inclusive.

Assuming that 100 percent of the on-characteristics is obtained when the ratio is 1, setting the value that is close to 1 as a value that is at least within 0.83 to 1.17, makes it possible to ensure a minimum of 70 percent of the on-characteristics.

Furthermore, in the thin-film transistor device according to an aspect of the present invention, the value close to the same value may be a value that is within 0.85 to 1.15 when the stacked thickness of the first channel layer and the second channel layer is between 105 and 115 nm, inclusive.

Assuming that 100 percent of the on-characteristics is obtained when the ratio is 1, setting the value that is close to 1 to at least a value that is within 0.85 to 1.15, makes it possible to ensure a minimum of 70 percent of the on-characteristics.

Hereinafter, the thin-film transistor device and the method for manufacturing the same, according to an embodiment of the present invention shall be described in detail with reference to the Drawings. In the subsequent Drawings, constituent elements having substantively the same functions are given the same reference sign in order to simplify description.

FIG. 1A is a cross-sectional view for schematically showing a configuration of the thin-film transistor device according to the present embodiment.

The thin-film transistor device is a top gate (staggered) thin-film transistor device and includes a substrate 100 and the following which are sequentially stacked on the substrate 100: a pair of a source electrode 110 and a drain electrode 120; a pair of silicon layers 130 and 140; a first channel layer 150; a second channel 160; a gate insulating film 170; and a gate electrode 180.

The substrate 100 is made of quartz glass, alkali-free glass, high strain point glass, or the like. It should be noted that a silicon oxide film, a silicon nitride film, or the like, of approximately 100 to 1000 nm thickness may be provided as a base coat layer on the substrate 100 for the passivation of the effects of impurities from the substrate.

The paired source electrode 110 and drain electrode 120 are provided separately on the substrate 110. Each of the source electrode 110 and the drain electrode 120 is a single-layer structure or multilayer structure of a conductive material, alloy, and so on, and is made of, for example, aluminum (Al), molybdenum (Mo), Copper (Cu), molybdenum tungsten (MoW), titanium (Ti), chromium (Cr), or a stacked film thereof. The thickness of the source electrode 110 and the drain electrode 120 is 100 to 500 nm.

Each of the source electrode 110 and the drain electrode 120 is formed by vapor deposition, electron beam evaporation, sputtering, plating, and so on.

The silicon layer 130 is stacked within the upper surface area of the source electrode 110, and has a side surface that is substantially flush with the side surface of the source electrode 110. In the same manner, the silicon layer 140 is stacked within the upper surface area of the drain electrode 120, and has a side surface that is substantially flush with the side surface of the drain electrode 120.

The silicon layer 130 is formed by doping an amorphous silicon layer with a high concentration of an n-type impurity such as phosphorus, and functions as a contact layer for realizing low-contact resistance between the first channel layer 150 and the source electrode 110. In the same manner, the silicon layer 140 is formed by doping an amorphous silicon layer with a high concentration of an n-type impurity such as phosphorus, and functions as a contact layer for realizing low-contact resistance between the first channel layer 150 and the drain electrode 120. The phosphorus impurity concentration of the silicon layer 130 and the silicon layer 140 is approximately $1 \times 10^{19}$ to $1 \times 10^{22}$ atoms/cm$^3$.

The first channel layer 150 is formed continuously, on the substrate 100 in the region between the source electrode 110 and the drain electrode 120, on the respective side surfaces of the source electrode 110 and the drain electrode 120, and on the respective side surfaces and top surfaces of the silicon layers 130 and 140. The channel layer 150 is made of an amorphous silicon layer that is not doped with impurities, and reduces off-current. Adopting a material having a larger bandgap than the second channel 160 in the first channel layer 150 allows the off-current to be reduced. For the bandgap of the first channel layer 150, it is preferable to use a material having a bandgap of 1.60 to 1.90 eV. Furthermore, a layer having a lower impurity concentration than the first channel layer 150 may be introduced between the first channel layer 150 and the second channel layer 160. Furthermore, the impurity of the first channel layer 150 may be such that a profile in which concentration decreases towards the second channel layer 160 is formed. In this manner, by designing the first channel layer 150 and the second channel layer 160 in such a way that the impurity concentration profile of the first channel layer 150 and the second channel layer 160 changes gently, the electric field at the drain region is mitigated and the off-current is further reduced.

The second channel layer 160 is stacked on the first channel layer 150, and formed continuously in the region between the source electrode 110 and the drain electrode 120, and laterally from and above the silicon layers 130 and 140. The second layer 160 is made of one of a polysilicon layer and a microcrystalline silicon layer, and increases the on-current. The polycrystalline silicon within the second channel layer 160 has a grain size of approximately 20 to 1,000 nm, which is a size that can be controlled using the film-forming condition and crystallization condition.

Here, each of the first channel layer 150 and the second channel layer 160 is sunken in a region (region C in FIG. 1A) between the source electrode 110 and the drain electrode 120, following the shape between the source electrode 110 and the drain electrode 120, and thus a sunken region and level regions (non-sunken regions) are formed. Furthermore, in the sunken region, the top surface of the second channel 160 is approximately flush with the top surface of the silicon layers 130 and 140.

The stacked body of the source electrode 110 and the silicon layer 130 is formed in the shape of an island on top of the substrate 100. In the same manner, the stacked body of the source electrode 120 and the silicon layer 140 is formed in the shape of an island on top of the substrate 100. Then, the first channel layer 150 is formed above the substrate 100 and in contact with the stacked bodies and the substrate, so as to cover the stacked bodies. The second channel layer 160 is formed on the first channel layer 150 and in contact with the first channel layer 150.

The gate insulating layer 170 is made of, for example, a silicon oxide ($SiO_x$), a silicon nitride ($SiN_x$), a silicon oxynitride (SiON), an aluminum oxide ($AlO_x$), a tantalum oxide ($TaO_x$), a stacked film thereof, and so on, and is formed on the second channel layer 160.

The gate electrode 180 is made of metal, for example, Al, Mo, Cu, molybdenum tungsten (MoW), Ti, Cr, and so on, or a stacked film thereof, and is formed on the gate insulating film 170. The gate electrode 180 has regions (regions D in FIG. 1A) that respectively overlap with the source electrode 110 and the drain electrode 120.

The stacked thickness of the source electrode 110 and the silicon layer 130 (A in FIG. 1A) and the stacked thickness of the drain electrode 120 and the silicon layer 140 (A in FIG. 1A) are respectively the same value, or a value close to the same value as the stacked thickness of the first channel layer 150 and the second channel layer 160. Stated differently, the ratio between the stacked thickness of the first channel layer 150 and the second channel layer 160 and each of the stacked thickness of the source electrode 110 and the silicon layer 130 and the stacked thickness of the drain electrode 120 and the silicon layer 140 is 1 or a value close to 1.

At this time, when the stacked thickness of the first channel layer 150 and the second channel layer 160 is 105 to 115 nm, "a value close to the same value" is a value that is within ±15 percent of "the same value". Stated differently, when the stacked thickness of the first channel layer 150 and the second channel layer 160 is 105 to 115 nm, "a value close to the same value" is a value that is within 0.85 to 1.15.

Furthermore, when the stacked thickness of the first channel layer 150 and the second channel layer 160 is 25 to 35 nm, "a value close to the same value" is a value that is within ±45 percent of "the same value". Stated differently, when the stacked thickness of the first channel layer 150 and the second channel layer 160 is 25 to 35 nm, "a value close to the same value" is a value that is within 0.55 to 1.45.

In addition, when the stacked thickness of the first channel layer 150 and the second channel layer 160 is 55 to 65 nm, "a value close to the same value" is a value that is within ±17 percent of "the same value". Stated differently, when the stacked thickness of the first channel layer 150 and the second channel layer 160 is 55 to 65 nm, "a value close to the same value" is a value that is within 0.83 to 1.17.

Figure 1B:
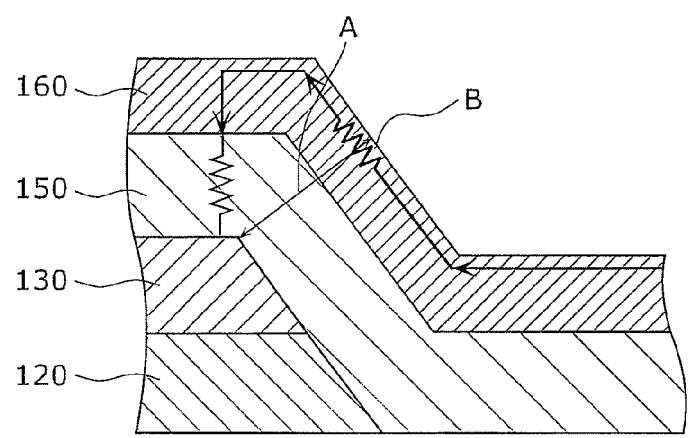
FIG. 1B is a diagram showing a path through which the drain current flows in the thin-film transistor device according to the embodiment.

In the thin-film transistor device having the configuration shown in FIG. 1A, when a voltage exceeding the threshold value of the thin-film transistor device is applied to the gate electrode 180 (in a state where the thin-film transistor device is turned ON), a depletion layer that is wider than a depletion layer formed between the silicon layers 130 and 140 and the first channel layer 150 is formed in a region of the first channel layer 150 which is in contact with the side surfaces of the source electrode 110 and the drain electrode 120. Such a depletion layer extends from the side surfaces of the source electrode 110 and the drain electrode 120 and towards the inside of the first channel layer 150 and the second channel layer 160, by as much as a range of extension that is determined by the work functions of the source electrode 110 and the drain electrode 120, and the bandgap and impurity concentration of the first channel layer 150 and the second channel layer 160. Therefore, the effect of the depletion layer on the inside the first channel layer 150 and the second channel layer 160 is different for the respective parts of the first channel layer 150 and the second channel layer 160. Specifically, the effect of the depletion layer on the first channel layer 150 and the second channel layer 160 is greatest on the region of the first channel layer 150 which is in contact with the side surfaces of the source electrode 110 and the drain electrode 120, and decreases as the distance therefrom increases. Resistance is less in a region in which the effect of the depletion layer is less. Therefore, in the state where the thin-film transistor device is turned ON, the current flowing between the source electrode 110 and the drain electrode 120 does not take the path flowing to the side surfaces of the source electrode 110 and the drain electrode 120 due to the effect of the depletion layer, and takes the inverted U-shaped path shown by the arrows in FIG. 1B (in FIG. 1A, the M-shaped path formed by the connection of the inverted U-shaped paths) and flows to the top surface of the source electrode 110 and the drain electrode 120. Such a current path is taken because the resistance (resistance B in FIG. 1B) of the boundary region between an end region (the region located at a minimum distance A from the corner of the silicon layer 130 in FIG. 1B) of the second channel 160 which is sunken between the source electrode 110 and the drain electrode 120 and the gate electrode 180 is less than the resistance of the region of the first channel layer 150 which is sunken between the source electrode 110 and the drain electrode 120 and is in contact with the side surfaces of the source electrode 110 and the drain electrode 120.

Figure 2:
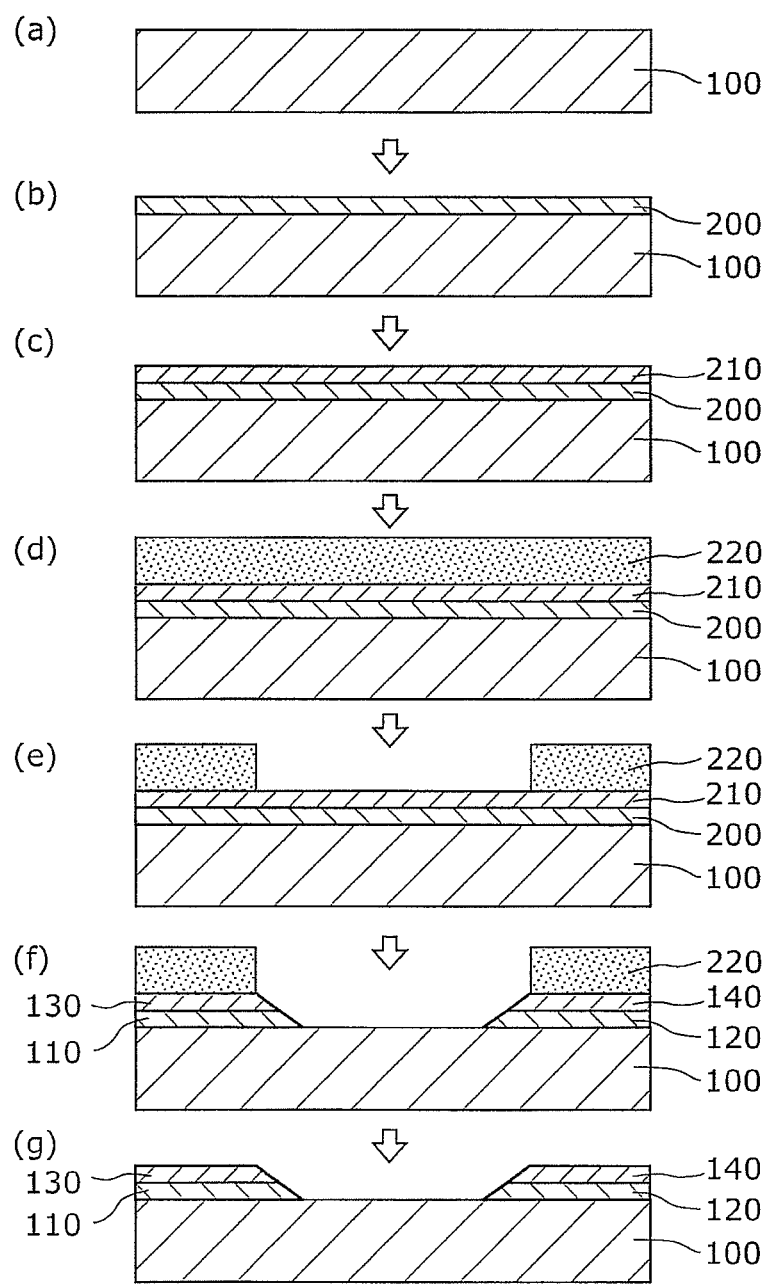
FIG. 2 is a cross-sectional view for schematically describing a method of manufacturing the thin-film transistor device according to the present embodiment.
Figure 3:
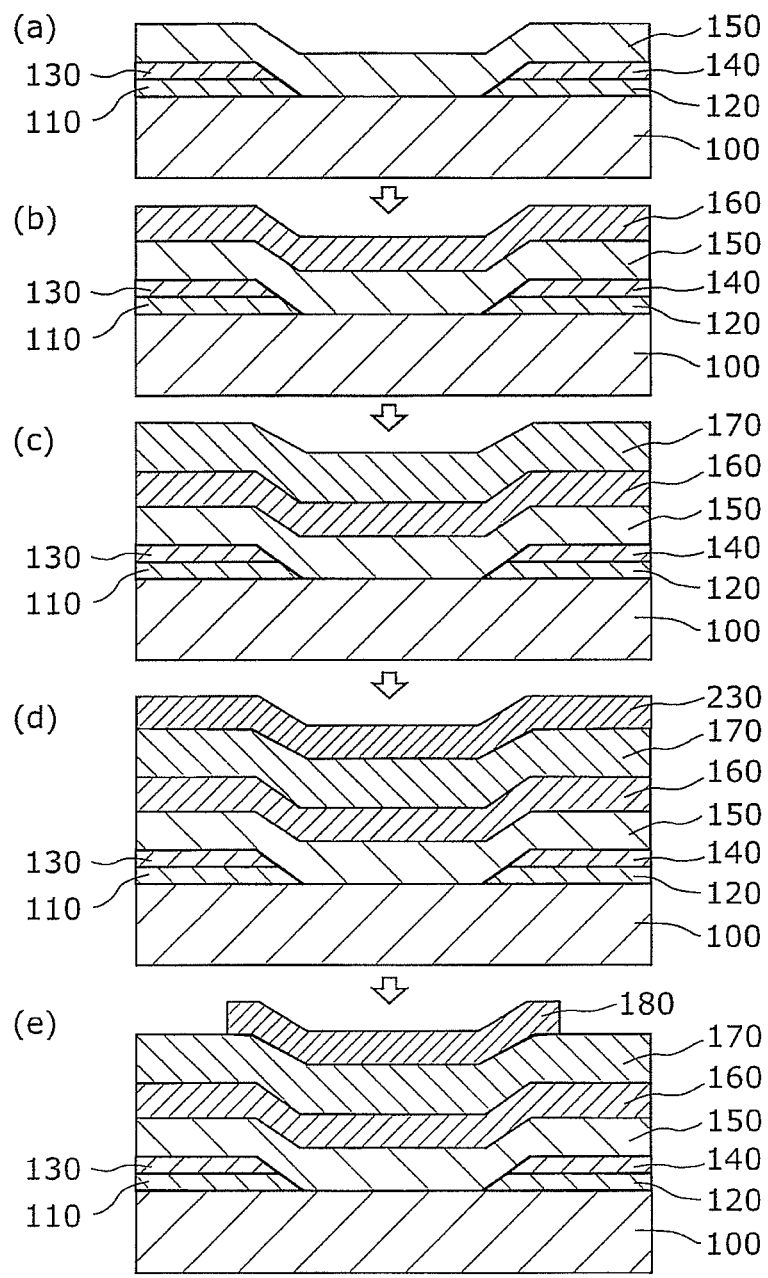
FIG. 3 is a cross-sectional view for schematically describing a method of manufacturing the thin-film transistor device according to the present embodiment.

FIG. 2 and FIG. 3 are cross-sectional views for schematically describing a method of manufacturing the thin-film transistor device according to the present embodiment.

First, as shown in (a) in FIG. 2, the substrate 100 is prepared.

Next, as shown in (b) in FIG. 2, a metal film 200 is formed on the substrate 100 by, for example, sputtering.

Next, as shown in (c) in FIG. 2, a silicon layer 210 which is amorphous and doped with an impurity is stacked on the metal film 200 by, for example, a CVD method. Here, the doping of the silicon layer 210 with an impurity can be made by adding a dopant gas during the forming of the silicon layer 210.

Next, as shown in (d) in FIG. 2, a photoresist 220 is formed by being applied on the silicon layer 120.

Next, as shown in (e) in FIG. 2, after a mask (not illustrated) is placed above the photoresist 220, the photoresist 220 is patterned into the desired shape by exposure and development using the mask.

Next, as shown in (f) in FIG. 2, dry etching is performed with the patterned photoresist 220 as a mask, and the metal film 200 and the silicon layer 210 are patterned collectively into the desired shape. The patterned metal film 200 is formed to be the source electrode 110 and the drain electrode 120. Furthermore, the patterned silicon layer 210 is formed to be the silicon layers 130 and 140 which serve as contact layers of the corresponding electrodes.

Next, as shown in (g) in FIG. 2, the photoresist 220 is removed.

Next, as shown in (a) in FIG. 3, the first channel layer 150, which is made of an amorphous silicon layer, is formed by plasma CVD for example, continuously, on the substrate 100 in the region between the source electrode 110 and the drain electrode 120, on the side surfaces of the source electrode 110 and the drain electrode 120, and on the side surfaces and top surfaces of the silicon layers 130 and 140.

Next, as shown in (b) in FIG. 3, the second channel layer 160, which is made of one of a polysilicon layer and a microcrystalline silicon layer, is formed on the first channel layer 150, continuously, in the region between the source electrode 110 and the drain electrode 120 and laterally from and above of the silicon layers 130 and 140, by plasma CVD using a silane series feed gas.

At this time, the processes shown in (a) and (b) in FIG. 3 are performed in the same plasma CVD apparatus, and the inside of the plasma CVD apparatus is not exposed to air in between the processes shown in (a) and (b) in FIG. 3.

In addition, the process shown in (a) in FIG. 3 is executed under a first plasma CVD condition, and the process shown in (b) in FIG. 3 is executed under a second plasma CVD condition different from the first plasma CVD condition.

Next, as shown in (c) in FIG. 3, the gate insulating layer 170 is formed on the second channel layer 160. Subsequently, in order to form the first channel layer 150, the second channel 160, and the gate insulating film 170 into an island-shape, patterning is performed collectively on the first channel layer 150, the second channel 160, and the gate insulating film 170, by, for example, dry etching.

Next, as shown in (d) in FIG. 3, a metal film 230 is formed on the gate insulating film 170 by, for example, sputtering.

Next, as shown in (e) in FIG. 3, wet etching using a photoresist mask is performed on the metal film 230, and the metal film 230 is patterned into the desired shape. The patterned metal film 230 is formed to be the gate electrode 180.

Here, in the processes shown in (c) and (d) in FIG. 2 and (a) and (b) in FIG. 3, the respective thicknesses of the metal film 200, the silicon layer 210, the first channel layer 150, and the second channel layer 160 are determined such that the stacked thickness of the source electrode 110 and the silicon layer 130 and the stacked thickness of the drain electrode 120 and the silicon layer 140 are respectively the same value, or a value close to the same value as the stacked thickness of the first channel layer 150 and the second channel layer 160.

It should be noted that in the method of manufacturing the thin-film transistor device shown in FIG. 2 and FIG. 3, patterning is performed on the metal film 200 and the silicon film 210 by collective etching. However, it is also acceptable to form and pattern only the metal film 200 to form the source electrode 110 and the drain electrode 120, and subsequently form the silicon layers 130 and 140 on the source electrode 110 and the drain electrode 120, respectively.

In this case, a photoresist is formed on the metal film 200 after the process shown in (a) in FIG. 2. Next, after a mask is placed above the photoresist, patterning is performed on the photoresist using the mask. Next, patterning is performed on the metal film 200 with the patterned photoresist as a mask, and the patterned metal film 200 is formed to be the source electrode 110 and the drain electrode 120. Next, the process shown in (a) in FIG. 3 is performed after stacking the amorphous, impurity-doped silicon layers 130 and 140 in predetermined regions on the top surface of the source electrode 110 and the drain electrode 120, respectively.

Figure 4:
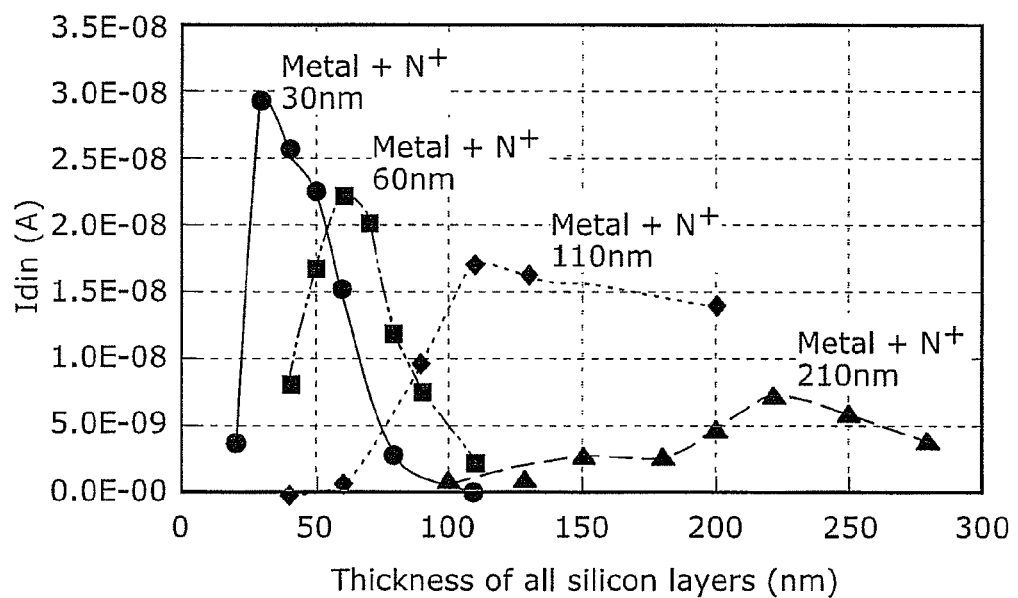
FIG. 4 is a graph showing changes in drain current when total thickness of a first channel layer and a second channel layer is changed.

FIG. 4 is a graph showing changes in drain current (on-current) when total thickness of the first channel layer 150 and the second channel layer 160 (total thickness of the channel layers) is changed.

It should be noted that, in FIG. 4, "●" denote changes in drain current when the thickness of each of the source electrode 110 and the drain electrode 120 is 20 nm, the thickness of each of the silicon films 130 and 140 is 10 nm, and the thickness of the second channel layer 160 is 10 nm. In the same manner, "◆" denote changes in drain current when the thickness of each of the source electrode 110 and the drain electrode 120 is 50 nm, the thickness of each of the silicon films 130 and 140 is 10 nm, and the thickness of the first channel layer 150 is 30 nm. Furthermore, "▲" denote changes in drain current when the thickness of each of the source electrode 110 and the drain electrode 120 is 100 nm, the thickness of each of the silicon films 130 and 140 is 10 nm, and the thickness of the first channel layer 150 is 30 nm. Furthermore, "▲" denote changes in drain current when the thickness of each of the source electrode 110 and the drain electrode 120 is 200 nm, the thickness of each of the silicon films 130 and 140 is 10 nm, and the thickness of the first channel layer 150 is 30 nm.

It can be understood from FIG. 4 that, in the case where the total thickness of either of the electrodes and the corresponding one of the silicon layers is 30 nm (the case of "●"), the drain current peaks when the total thickness of the channel layers is 30 nm. In the same manner, it can be understood that the drain current peaks when the total thickness of the channel layers is 60 nm in the case where the total thickness of either of the electrodes and the corresponding one of the silicon layers is 60 nm (the case of "■"), and when the total thickness of the channel layers is 110 nm in the case where the total thickness of the either of the electrodes and the corresponding one of the silicon layers is 110 nm (the case of "◆"). In other words, it can be understood that optimal drain current can be obtained when the total thickness of either of the electrodes and the corresponding one of the silicon layers is equal to the total thickness of the channel layers.

However, in the case where the total thickness of the channel layers is 210 nm (the case of "▲" in the figure), drain current (on-current) is equal to or less than $1.0 \times 10^{-8}$ A even at the peak, and compared to the change when the total thickness of the channel layers is 110 nm, change that is like a gentler mountain with a wider base, that is, change that is like a mounting that is gentler and having a wider base at a location near 0 A of the drain current (on-current) is indicated, which is change in which a peak does not easily appear. In this case, no matter what thickness is set for the stacked thickness of the source electrode 110 and the silicon layer 130 or the stacked thickness of the drain electrode 120 and the silicon layer 140, the drain current (on-current) becomes equal to or less than $1.0 \times 10^{-8}$ A. Therefore, in order to realize the advantageous effect of making the total thickness of either of the electrodes and the corresponding one of the silicon layers and the total thickness of the channel layers equal, that is, the advantageous effect in which the optimal drain current is obtained, it is necessary for the total thickness of the channel layers to be less than 210 nm, and specifically, equal to or less than 130 nm.

Figure 5:
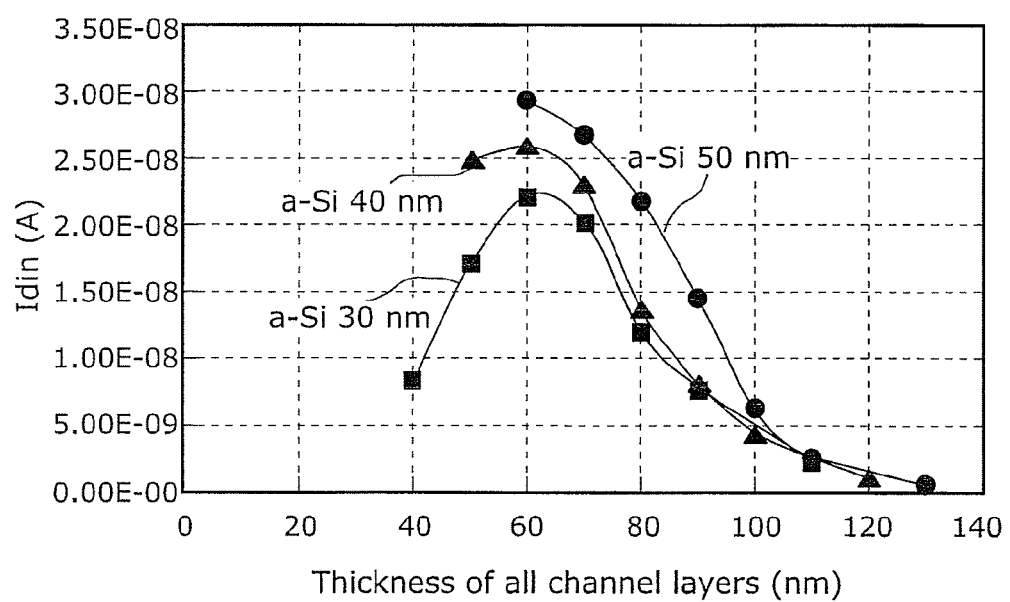
FIG. 5 is a graph showing changes in drain current when the thickness ratio between the first channel layer and the second channel layer is changed.

FIG. 5 is a graph showing the change in the drain current (on-current) when the ratio of thicknesses between the first channel layer 150 and the second channel layer 160 is changed.

It should be noted that, in FIG. 5, "■" denote changes in drain current when the thickness of each of the source electrode 110 and the drain electrode 120 is 50 nm, the thickness of each of the silicon films 130 and 140 is 10 nm, and the thickness of the first channel layer 150 is 30 nm. In the same manner, "▲" denote changes in drain current when the thickness of each of the source electrode 110 and the drain electrode 120 is 50 nm, the thickness of each of the silicon films 130 and 140 is 10 nm, and the thickness of the first channel layer 150 is 40 nm. Furthermore, "●" denote changes in drain current when the thickness of each of the source electrode 110 and the drain electrode 120 is 50 nm, the thickness of each of the silicon films 130 and 140 is 10 nm, and the thickness of the first channel layer 150 is 50 nm.

It can be understood from FIG. 5 that the optimal drain current can be obtained when the total thickness of the channel layers is 60 nm, and the total thickness of either of the electrodes and the corresponding one of the silicon layers is equal to 60 nm.

Figure 6A:
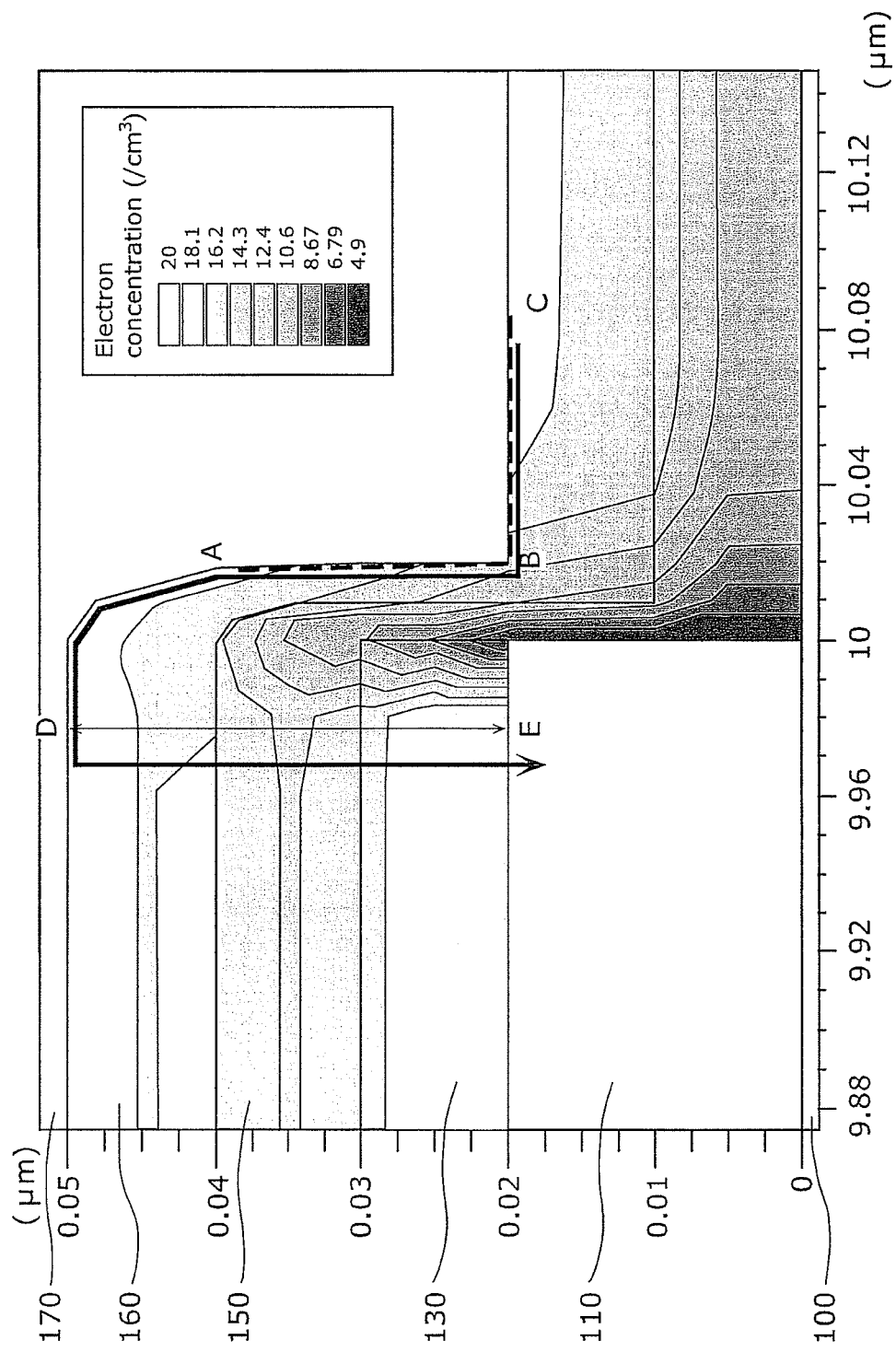
FIG. 6A is a graph showing an electron density distribution when the total thickness of either of the electrodes and the corresponding one of the silicon layers is greater than the total thickness of the channel layers.
Figure 6B:
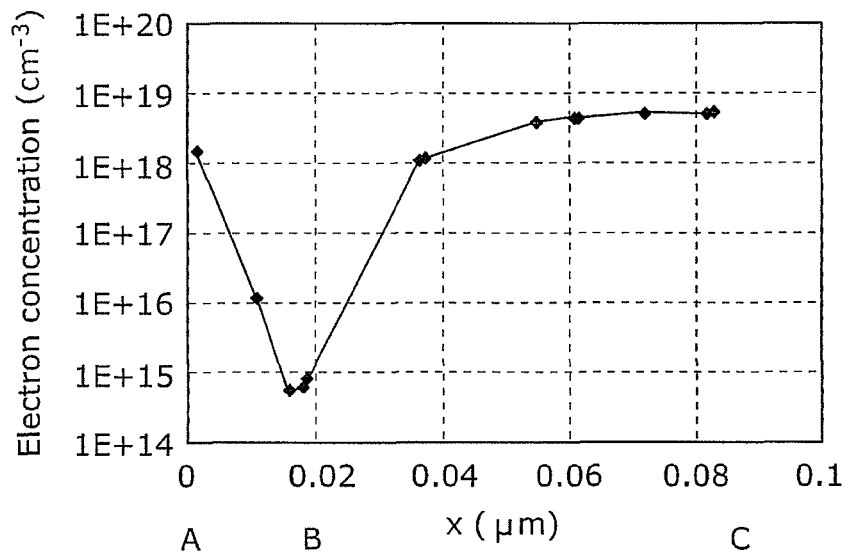
FIG. 6B is a graph showing the change in electron density for line A-B-C in FIG. 6A.
Figure 6C:
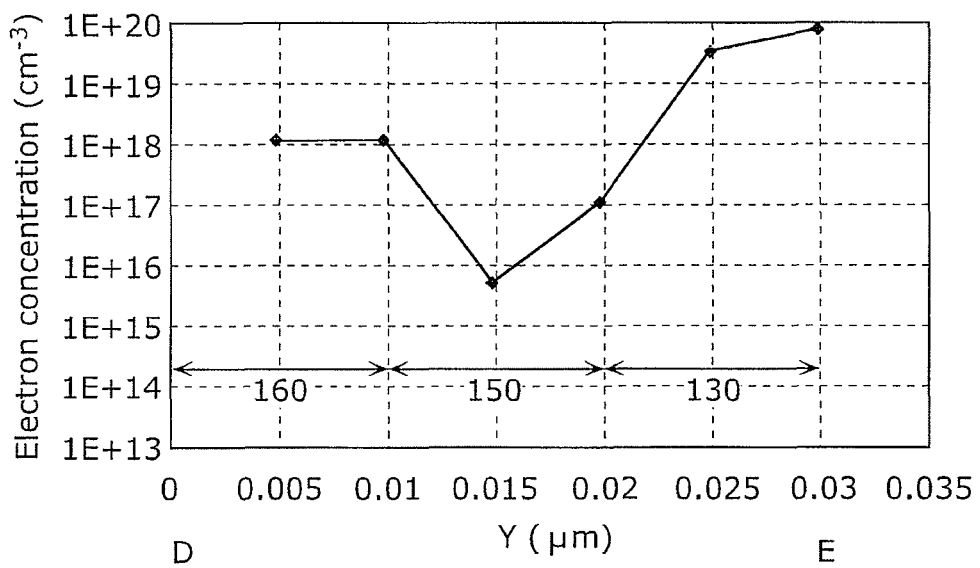
FIG. 6C is a graph showing the change in electron density for line D-E in FIG. 6A.

FIG. 6A is a graph showing an electron density distribution when the total thickness of either of the electrodes and the corresponding one of the silicon layers is greater than the total thickness of the channel layers. Specifically, FIG. 6A is a graph showing the electron density distribution when the thickness of the source electrode 110 is 20 nm, the thickness of the silicon layer 130 is 10 nm, the thickness of the first channel layer 150 is 10 nm, and the thickness of the second channel layer 160 is 10 nm, and the drain-source voltage is set to 0.1 V and the gate-drain voltage is set to 20 V. In addition, FIG. 6B is a graph showing the change in electron density for line A-B-C in FIG. 6A. In the same manner, FIG. 6C is a graph showing the change in electron density for line D-E in FIG. 6A.

Figure 7A:
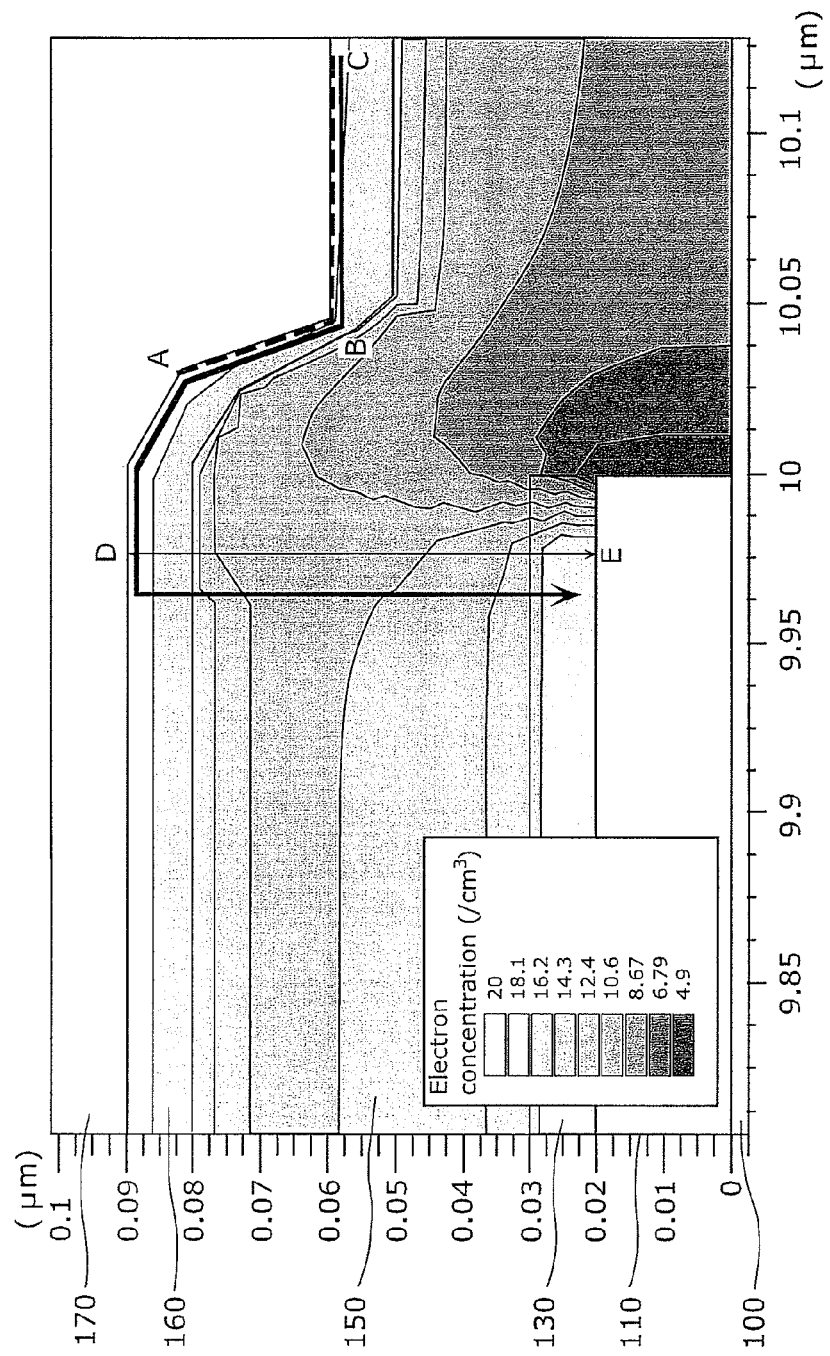
FIG. 7A is a graph showing an electron density distribution when the total thickness of either of the electrodes and the corresponding one of the silicon layers is less than the total thickness of the channel layers.
Figure 7B:
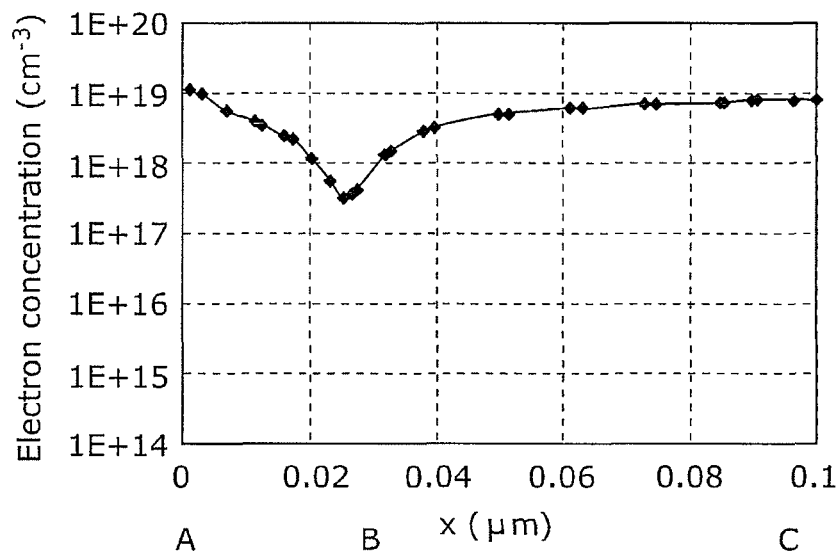
FIG. 7B is a graph showing the change in electron density for line A-B-C in FIG. 7A.
Figure 7C:
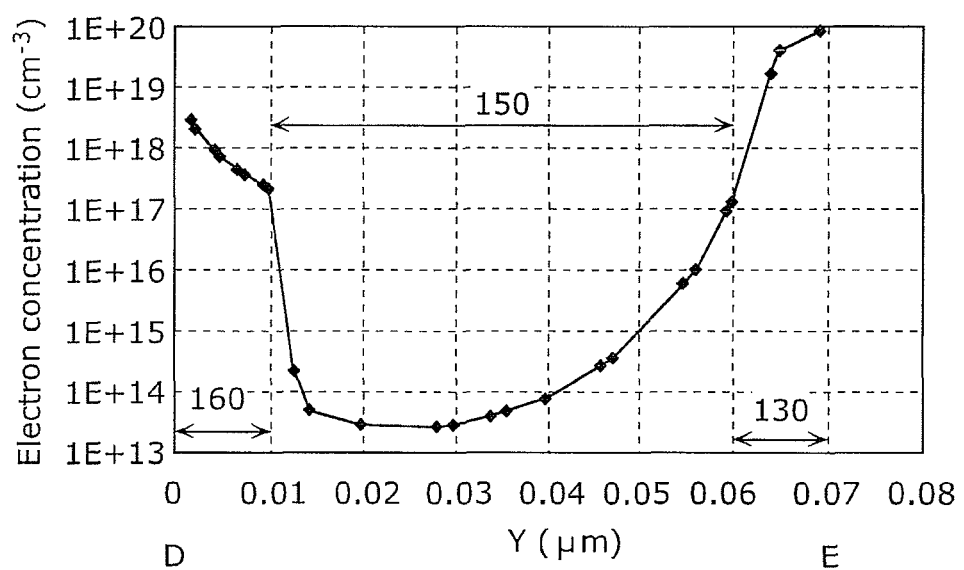
FIG. 7C is a graph showing the change in electron density for line D-E in FIG. 7A.

FIG. 7A is a graph showing an electron density distribution when the total thickness of the either of the electrodes and the corresponding one of the silicon layers is less than the total thickness of the channel layers. Specifically, FIG. 7A is a graph showing the electron density distribution when the thickness of the source electrode 110 is 20 nm, the thickness of the silicon layer 130 is 10 nm, the thickness of the first channel layer 150 is 50 nm, and the thickness of the second channel layer 160 is 10 nm, and the drain-source voltage is set to 0.1 V and the gate-drain voltage is set to 20 V. In addition, FIG. 7B is a graph showing the change in electron density for line A-B-C in FIG. 7A. In the same manner, FIG. 7C is a graph showing the change in electron density for line D-E in FIG. 7A.

Figure 8A:
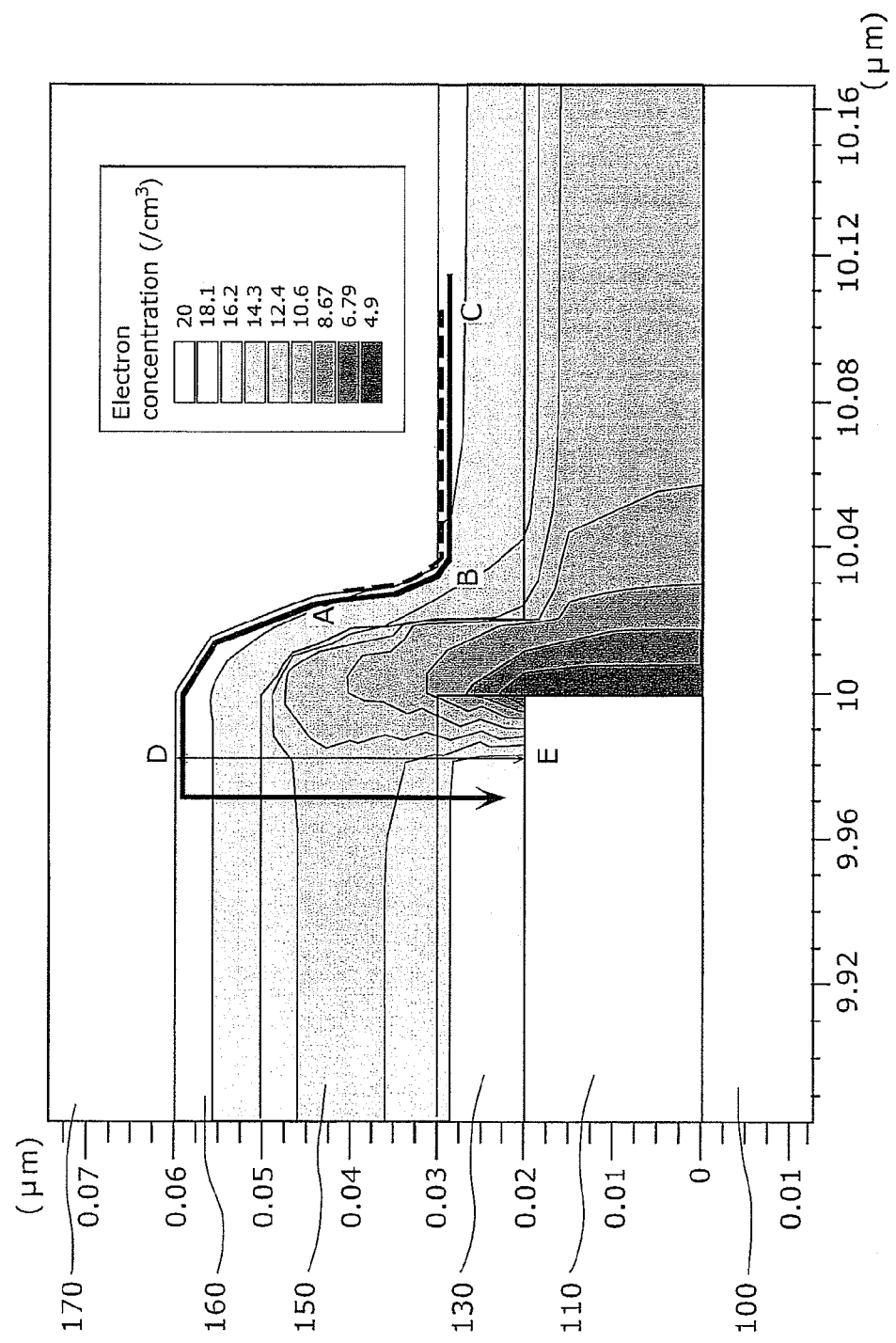
FIG. 8A is a graph showing an electron density distribution when the total thickness of either of the electrodes and the corresponding one of the silicon layers is equal to the total thickness of the channel layers.
Figure 8B:
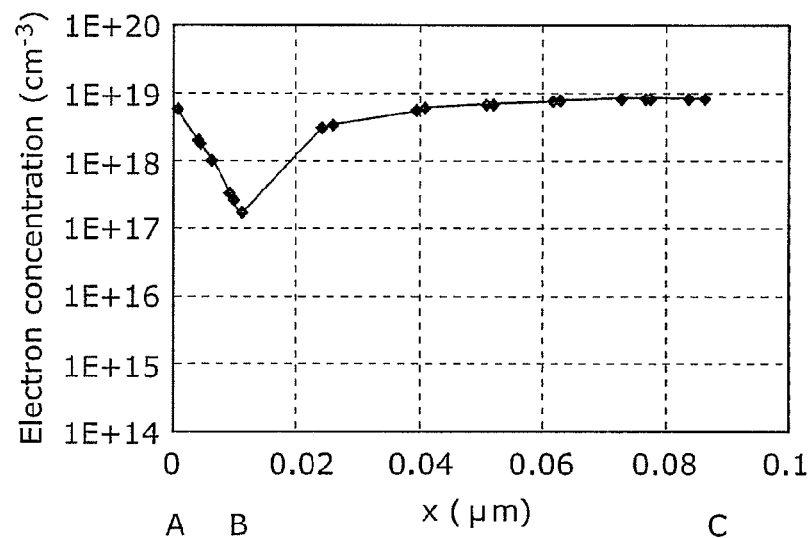
FIG. 8B is a graph showing the change in electron density for line A-B-C in FIG. 8A.
Figure 8C:
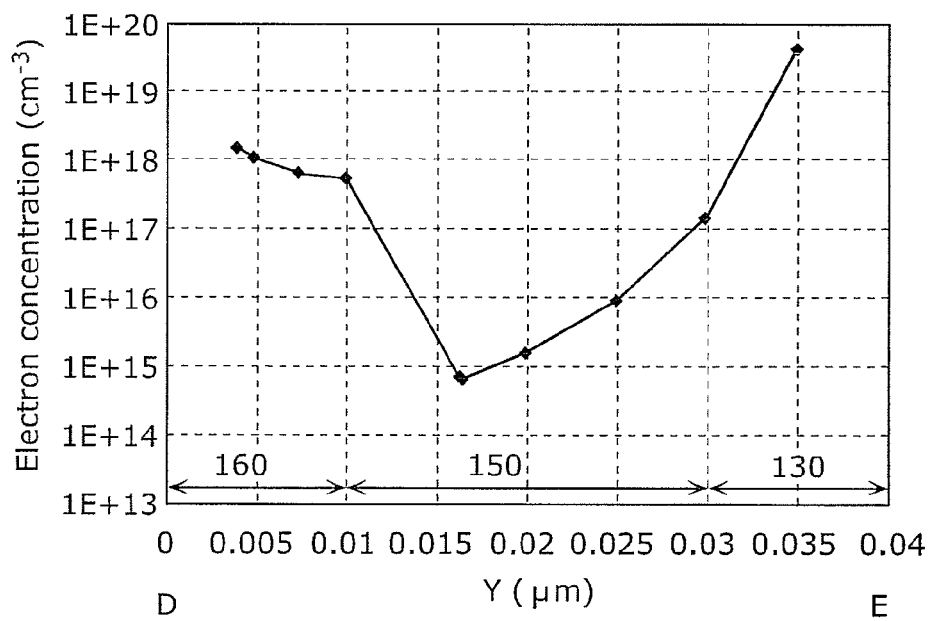
FIG. 8C is a graph showing the change in electron density for line D-E in FIG. 8A.

FIG. 8A is a graph showing an electron density distribution when the total thickness of either of the electrodes and the corresponding one of the silicon layers is equal to the total thickness of the channel layers. Specifically, FIG. 8A is a graph showing the electron density distribution when the thickness of the source electrode 110 is 20 nm, the thickness of the silicon layer 130 is 10 nm, the thickness of the first channel layer 150 is 20 nm, and the thickness of the second channel layer 160 is 10 nm, and the drain-source voltage is set to 0.1 V and the gate-drain voltage is set to 20 V. In addition, FIG. 8B is a graph showing the change in electron density for line A-B-C in FIG. 8A. In the same manner, FIG. 8C is a graph showing the change in electron density for line D-E in FIG. 8A.

At this time, both ends of the gate electrode 180 are located above the source electrode 110 and the drain electrode 120, and the gate electrode 180 has regions that respectively overlap with the source electrode 110 and the drain electrode 120. Therefore, the depletion layer created in the region of the first channel layer 150 which is in contact with the side surfaces of the source electrode 110 and the drain electrode 120 extends towards regions above the side surfaces of the source electrode 110 and the drain electrode 120 (towards both ends of the gate electrode 180). Therefore, the current from the drain electrode 120 to the source electrode 110 takes a path which avoids such depletion layer which extends towards regions above the electrodes (regions where the effect of the depletion layer is great). Here, since the first channel layer 150 and the second channel layer 160 are sunken at a region between the source electrode 110 and the drain electrode 120, following the shape between the source electrode 110 and the drain electrode 120, the path of current from the drain electrode 120 to the source electrode 110 (the current path indicated by an arrow in FIG. 6A, FIG. 7A, and FIG. 8A) circumvents widely, in an inverted U-shape, the region in which the effect of the depletion layer is great. The region of the inverted U-shaped current path on the second channel layer 160 surface (the region defined by line A-B-C in FIG. 6A, FIG. 7A, and 8A) is assumed to be a first region, and the region of the inverted U-shaped current path above the silicon layer 130 and the source electrode 110 (the region defined by line D-E in FIG. 6A, FIG. 7A, and 8A) is assumed to be a second region. The electron density of the first region is high compared to the electron density of the region of the first channel layer 150 which is in contact with the side surfaces of the source electrode 110 and the drain electrode 120. This is due to the effect of the depletion layer created in the region which is in contact with the side surfaces of the source electrode 110 and the drain electrode 120. Therefore, the current from the drain electrode 120 to the source electrode 110 takes a path which moves along a region of the second channel layer 160 that borders the gate insulating film 170, up to a region above the source electrode 110 to avoid the side surfaces and the region above the side surfaces in which the effect of the depletion layer is great, and subsequently moves downward at the region above the source electrode 110 towards the source electrode 110 after going past the region above the side surface of the source electrode 110. Since the gate electrode 180 has regions overlapping with the source electrode 110 and the drain electrode 120, the current from the drain electrode 120 to the source electrode 110 can move along the region of the second channel layer 160 which borders the gate insulating film 170, until it goes past the region above the side surface of the source electrode 110. Since the current can flow in such manner to avoid the depletion layer, it is possible to suppress the decrease in the amount of current caused by the depletion layer created in the first channel layer affecting the second channel layer.

It should be noted that the shape of the electron density distribution in FIG. 6A, FIG. 7A, and 8A corresponds to the shape of the depletion layer.

It can be understood from FIG. 6A to FIG. 8C that, in a configuration in which the first channel layer 150, that is, an amorphous silicon layer is in direct contact with the side surfaces of the source electrode 110 and the silicon layer 130, a depletion layer is created in the area of the first channel layer 150 which is in contact with the side surfaces of the source electrode 110 and the silicon layer 130.

In addition, it can be understood from FIG. 6A to FIG. 6C that, when the total thickness of each pair of the electrodes and the silicon layers is made greater than the total thickness of the channel layers, the electron density in the first region inside the second channel layer 160 decreases and electric charge mobility decreases due to the effect of the depletion layer created inside the first channel layer 150. Specifically, it is understood that the current flowing from the source electrode 110 to the drain electrode 120 via the second channel layer 160 decreases, and the characteristics of the thin-film transistor device deteriorate.

Furthermore, it is understood from FIG. 7A to FIG. 7C that, when the total thickness of the each pair of electrodes and the silicon layers is made less than the total thickness of the channel layers, the effect of the depletion layer created inside the first channel layer 150 on the first region inside the second channel layer 160 decreases, and thus the electron density in the first region inside the second channel layer 160 increases and electric charge mobility increases. At the same time, it is understood that the electrical resistance in the second region inside the second channel layer 160 increases by as much as the increase in the total thickness of the channel layers. Specifically, it is understood that the current flowing from the source electrode 110 to the drain electrode 120 via the second channel layer 160 decreases, and the characteristics of the thin-film transistor device deteriorate.

In contrast, it is understood from FIG. 8A to FIG. 8C that, when the total thickness of each pair of the electrodes and the silicon layers and the total thickness of the channel layers are made equal, the effect of the depletion layer created inside the first channel layer 150 on the first region inside the second channel layer 160 decreases, and thus the deterioration of the electron density in the first region inside the second channel layer 160 is suppressed, and the decrease in electric charge mobility is suppressed. At the same time, it is understood that the electrical resistance in the second region inside the second channel layer 160 decreases by as much as the decrease in the total thickness of the channel layers, and the decrease in the amount of current attributable to the total thickness of the channel layers can be suppressed. Specifically, it is understood that the current flowing from the source electrode 110 to the drain electrode 120 via the second channel layer 160 is optimized, and the characteristics of the thin-film transistor device improves significantly.

As described above, according to thin-film transistor device and the method of manufacturing the same in the present embodiment, the stacked thickness of either of the electrodes and the corresponding one of the silicon layers is the same value or a value close to the same value as the stacked thickness of the first channel layer 150 and the second channel layer 160. Therefore, it is possible to realize a thin-film transistor device that can optimize the current flowing from the source electrode 110 to the drain electrode 120 via the second channel layer 160 and allow obtainment of sufficient carrier mobility, and a method of manufacturing the same. Furthermore, since disconnection caused by a step does not occur easily at the parts of the stacked body of the first channel layer 150 and the second channel layer 160 which are located above the side surfaces of the source electrode 110 and the drain electrode 120 and the silicon layers 130 and 140, a thin-film transistor device having high manufacturing yield and a method of manufacturing the same can be realized.

Furthermore, according to the thin-film transistor device and a method of manufacturing the same according to the present embodiment, patterning is performed on the metal film 200 and the silicon film 210 by collective etching using the same mask, and thus the source electrode 110 and the drain electrode 120 and the silicon layers 130 and 140 are formed at the same time. Therefore, since simplification of the manufacturing process and reduction of the number of masks becomes possible, it is possible to realize a method of manufacturing a thin-film transistor which enables improvement of productivity and reduction of manufacturing cost.

Furthermore, according to the method of manufacturing a thin-film transistor device according to the present embodiment, the source electrode 110 and the drain electrode 120 and the silicon layers 130 and 140 are formed collectively. When the silicon layers 130 and 140 are to be formed after forming the source electrode 110 and the drain electrode 120, the silicon layers 130 and 140 are also formed on the side surfaces of the source electrode 110 and the drain electrode 120. However, it is difficult to form the silicon layers 130 and 140 on the side surfaces of the source electrode 110 and the drain electrode 120 and, even when formed, the silicon layers 130 and 140 formed on the side surfaces of the source electrode 110 and the drain electrode 120 have an unstable doping state and thus it is difficult to stabilize film quality. As a result, it is difficult to manufacture a thin-film transistor device having stable characteristics. In contrast, according to the method of manufacturing a thin-film transistor device according to the present embodiment, it is possible to manufacture a thin-film transistor device having stable characteristics.

Furthermore, according to the method of manufacturing a thin-film transistor device according to the present embodiment, the second channel layer 160 is formed by plasma CVD using a silane series feed gas. Plasma CVD using a silane series feed gas allows the formation of a crystalline silicon film even when the substrate temperature is low, since it is easy to arbitrarily set the plasma condition, feed gas type, and so on. Therefore, since the second channel layer 160 can be formed without altering the side surface form, composition, and doping state of the silicon layers 130 and 140, it is possible to realize a method of manufacturing a thin-film transistor device which can suppress the deterioration of the characteristics of the contact layer brought about by channel layer formation.

Although the thin-film transistor device and the method of manufacturing the same according to the present invention have been described based on an embodiment, the present invention is not limited to such embodiment. Various modifications that may be conceived by those skilled in the art which do not depart from the essence of the present invention are intended to be included within the scope of the present invention. Furthermore, respective constituent elements of different exemplary embodiments may be arbitrarily combined within the scope of the essence of the present invention.

INDUSTRIAL APPLICABILITY

The present invention can be used in a thin-film transistor device and a method of manufacturing the same, and can be used particularly in a display apparatus, and the like, such as an organic EL display device and a liquid crystal display device.

What is claimed is:

1. A thin-film transistor device comprising:
a substrate;
a source electrode and a drain electrode formed on the substrate;
silicon layers, one of which is stacked within a top surface region of the source electrode and an other of which is stacked within a top surface of the drain electrode, the silicon layers being amorphous and doped with an impurity;
a first channel layer formed continuously (i) on the substrate, in a region between the source electrode and the drain electrode, (ii) on a side surface of each of the source electrode and the drain electrode, and (iii) on a side surface and a top surface of each of the silicon layers, the first channel layer being made of an amorphous silicon layer;
a second channel layer stacked on the first channel layer and made of one of a polysilicon layer and a microcrystalline silicon layer, the second channel layer being formed continuously (i) in a region between the source electrode and the drain electrode and (ii) laterally from and above the silicon layers;
a gate insulating film formed on the second channel layer; and
a gate electrode formed on the gate insulating film,
wherein a stacked thickness of either the source electrode or the drain electrode and a corresponding one of the silicon layers is a same value or a value close to the same value as a stacked thickness of the first channel layer and the second channel layer,
the stacked thickness of the first channel layer and the second channel layer is the same in the region between the source electrode and the drain electrode and above the source electrode and the drain electrode,
the first channel layer and the second channel layer are sunken in the region between the source electrode and the drain electrode, following a shape between the source electrode and the drain electrode, and
the gate electrode has one region overlapping with the source electrode and an other region overlapping with the drain electrode.

2. The thin-film transistor device according to claim 1, wherein, when the thin-film transistor device is turned ON, a resistance of a boundary region between (i) an end region of the second channel layer which is sunken between the source electrode and the drain electrode and (ii) the gate electrode is less than a resistance of a region of the first channel layer which is sunken between the source electrode and the drain electrode, that is in contact with the source electrode and the drain electrode.

3. The thin-film transistor device according to claim 1, wherein the stacked thickness of the first channel layer and the second channel layer is equal to or less than 130 nm.

4. The thin-film transistor device according to claim 1, wherein the value close to the same value is a value that is within ±15 percent of the same value.

5. The thin-film transistor device according to claim 1, wherein the value close to the same value is a value that is within ±45 percent of the same value when the stacked thickness of the first channel layer and the second channel layer is between 25 and 35 nm, inclusive.

6. The thin-film transistor device according to claim 1, wherein the value close to the same value is a value that is within ±17 percent of the same value when the stacked thickness of the first channel layer and the second channel layer is between 55 and 65 nm, inclusive.

7. The thin-film transistor device according to claim 1, wherein the value close to the same value is a value that is within ±15 percent of the same value when the stacked thickness of the first channel layer and the second channel layer is between 105 and 115 nm, inclusive.

8. A method of manufacturing a thin-film transistor device, comprising:

preparing a substrate;
forming a metal film on the substrate;
forming a resist on the metal film;
placing a mask above the resist;
patterning the resist using the mask, patterning the metal film using the patterned resist as a mask to form the patterned metal film into a source electrode and a drain electrode;
stacking silicon layers which are amorphous and doped with an impurity, one of the silicon layers being stacked within a predetermined region in a top surface of the source electrode, and an other of the silicon layers being stacked within a predetermined region in a top surface of the drain electrode;
forming a first channel layer continuously (i) on the substrate, in a region between the source electrode and the drain electrode, (ii) on a side surface of each of the source electrode and the drain electrode, and (iii) on a side surface and a top surface of each of the silicon layers, the first channel layer being made of an amorphous silicon layer;
forming a second channel layer on the first channel layer, continuously (i) in a region between the source electrode and the drain electrode and (ii) laterally from and above the silicon layers, the second channel layer being made of one of a polysilicon layer and a microcrystalline silicon layer;
forming a gate insulating film on the second channel layer; and
forming a gate electrode formed on the gate insulating film,
wherein a stacked thickness of either the source electrode or the drain electrode and a corresponding one of the silicon layers is a same value or a value close to the same value as a stacked thickness of the first channel layer and the second channel layer,
the stacked thickness of the first channel layer and the second channel layer is the same in the region between the source electrode and the drain electrode and above the source electrode and the drain electrode,
the first channel layer and the second channel layer are sunken in the region between the source electrode and the drain electrode, following a shape between the source electrode and the drain electrode, and
the gate electrode has one region overlapping with the source electrode and an other region overlapping with the drain electrode.

9. The method of manufacturing a thin-film transistor device according to claim 8,
wherein, when the thin-film transistor device is turned ON, a resistance of a boundary region between (i) an end region of the second channel layer which is sunken between the source electrode and the drain electrode and (ii) the gate electrode is less than a resistance of a region of the first channel layer which is sunken between the source electrode and the drain electrode, that is in contact with the source electrode and the drain electrode.

10. The method of manufacturing a thin-film transistor device according to claim 8,
wherein the stacked thickness of the first channel layer and the second channel layer is equal to or less than 130 nm.

11. A method of manufacturing a thin-film transistor device, comprising:
preparing a substrate;
forming a metal film on the substrate;
stacking a silicon layer on the metal film, the silicon layer being amorphous and doped with an impurity;
forming a resist on the silicon layer;
placing a mask above the resist;
patterning the resist using the mask, collectively patterning the metal film and the silicon layer using the patterned resist as a mask to form the patterned metal film into a source electrode and a drain electrode;
forming a first channel layer continuously (i) on the substrate, in a region between the source electrode and the drain electrode, (ii) on a side surface of each of the source electrode and the drain electrode, and (iii) on a side surface and a top surface of silicon layers resulting from the patterning the silicon layer, the first channel layer being made of an amorphous silicon layer;
forming a second channel layer on the first channel layer, continuously (i) in a region between the source electrode and the drain electrode and (ii) laterally from and above the silicon layers, the second channel layer being made of one of a polysilicon layer and a microcrystalline silicon layer;
forming a gate insulating film on the second channel layer; and
forming a gate electrode formed on the gate insulating film,
wherein a stacked thickness of either the source electrode or the drain electrode and a corresponding one of the silicon layers is a same value or a value close to the same value as a stacked thickness of the first channel layer and the second channel layer,
the stacked thickness of the first channel layer and the second channel layer is the same in the region between the source electrode and the drain electrode and above the source electrode and the drain electrode,
the first channel layer and the second channel layer are sunken in the region between the source electrode and the drain electrode, following a shape between the source electrode and the drain electrode, and
the gate electrode has one region overlapping with the source electrode and an other region overlapping with the drain electrode.

12. The method of manufacturing a thin-film transistor device according to claim 11,
wherein, when the thin-film transistor device is turned ON, a resistance of a boundary region between (i) an end region of the second channel layer which is sunken between the source electrode and the drain electrode and (ii) the gate electrode is less than a resistance of a region of the first channel layer which is sunken between the source electrode and the drain electrode, that is in contact with the source electrode and the drain electrode.

13. The method of manufacturing a thin-film transistor device according to claim 11,
wherein the stacked thickness of the first channel layer and the second channel layer is equal to or less than 130 nm.

14. The method of manufacturing a thin-film transistor device according to claim 11,
wherein in the forming of a second channel layer, the second channel layer is formed by plasma CVD using a silane series feed gas.

15. The method of manufacturing a thin-film transistor device according to claim 14,
wherein the forming of a first channel layer and the forming of a second channel layer are performed in a same plasma CVD apparatus,
the forming of a first channel layer is performed under a first plasma CVD condition, and the forming of a second channel layer is performed under a second plasma CVD condition, and an inside of the plasma CVD apparatus is not exposed to air in between the forming of a first channel layer and the forming of a second channel layer.

16. A thin-film transistor device comprising:
a substrate;
a source electrode and a drain electrode formed on the substrate;
silicon layers, one of which is stacked within a top surface region of the source electrode and an other of which is stacked within a top surface of the drain electrode, the silicon layers being amorphous and doped with an impurity;
a first channel layer formed continuously (i) on the substrate, in a region between the source electrode and the drain electrode, (ii) on a side surface of each of the source electrode and the drain electrode, and (iii) on a side surface and a top surface of each of the silicon layers, the first channel layer being made of an amorphous silicon layer;
a second channel layer stacked on the first channel layer and made of one of a polysilicon layer and a microcrystalline silicon layer, the second channel layer being formed continuously (i) in a region between the source electrode and the drain electrode and (ii) laterally from and above the silicon layers;
a gate insulating film formed on the second channel layer; and
a gate electrode formed on the gate insulating film,
wherein a ratio of a stacked thickness of either the source electrode or the drain electrode and a corresponding one of the silicon layers to a stacked thickness of the first channel layer and the second channel layer is 1 or a close value to 1,
the stacked thickness of the first channel layer and the second channel layer is the same in the region between the source electrode and the drain electrode and above the source electrode and the drain electrode,
the first channel layer and the second channel layer are sunken in the region between the source electrode and the drain electrode, following a shape between the source electrode and the drain electrode, and
the gate electrode has one region overlapping with the source electrode and an other region overlapping with the drain electrode.

17. The thin-film transistor device according to claim 16, wherein, when the thin-film transistor device is turned ON, a resistance of a boundary region between (i) an end region of the second channel layer which is sunken between the source electrode and the drain electrode and (ii) the gate electrode is less than a resistance of a region of the first channel layer which is sunken between the source electrode and the drain electrode, that is in contact with the source electrode and the drain electrode.

18. The thin-film transistor device according to claim 16, wherein the stacked thickness of the first channel layer and the second channel layer is equal to or less than 130 nm.

19. The thin-film transistor device according to claim 16, wherein the close value is a value that is within 0.85 to 1.15, inclusive.

20. The thin-film transistor device according to claim 16, wherein the close value is a value that is within 0.55 to 1.45, inclusive, when the stacked thickness of the first channel layer and the second channel layer is between 25 and 35 nm, inclusive.

21. The thin-film transistor device according to claim 16, wherein the value close to the same value is a value that is within 0.83 to 1.17, inclusive, when the stacked thickness of the first channel layer and the second channel layer is between 55 and 65 nm, inclusive.

22. The thin-film transistor device according to claim 16, wherein the value close to the same value is a value that is within 0.85 to 1.15 when the stacked thickness of the first channel layer and the second channel layer is between 105 and 115 nm, inclusive.

23. The method of manufacturing a thin-film transistor device according to claim 8,
wherein in the forming of a second channel layer, the second channel layer is formed by plasma CVD using a silane series feed gas.

24. The method of manufacturing a thin-film transistor device according to claim 8,
wherein the forming of a first channel layer and the forming of a second channel layer are performed in a same plasma CVD apparatus,
the forming of a first channel layer is performed under a first plasma CVD condition, and the forming of a second channel layer is performed under a second plasma CVD condition, and
an inside of the plasma CVD apparatus is not exposed to air in between the forming of a first channel layer and the forming of a second channel layer.

25. The thin-film transistor device according to claim 1, wherein a top surface of the first channel layer and a top surface of the second channel layer are sunken in the region between the source electrode and the drain electrode, following a shape between the source electrode and the drain electrode.

* * * * *